(12) United States Patent
Kurokawa et al.

(10) Patent No.: US 7,388,291 B2
(45) Date of Patent: Jun. 17, 2008

(54) SEMICONDUCTOR DEVICE AND METHOD OF FABRICATING THE SAME

(75) Inventors: Tetsuya Kurokawa, Kawasaki (JP); Koji Arita, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 328 days.

(21) Appl. No.: 11/063,565

(22) Filed: Feb. 24, 2005

(65) Prior Publication Data

US 2005/0189654 A1 Sep. 1, 2005

(30) Foreign Application Priority Data

Feb. 27, 2004 (JP) .............................. 2004-053620

(51) Int. Cl.
*H01L 23/48* (2006.01)
(52) U.S. Cl. ........................ 257/758; 257/759; 257/760
(58) Field of Classification Search ................ 438/612, 438/614, 620, 640; 257/758, 759, 760
See application file for complete search history.

(56) References Cited

U.S. PATENT DOCUMENTS

| 6,157,081 A * | 12/2000 | Nariman et al. ............ 257/752 |
| 6,297,557 B1 * | 10/2001 | Bothra ......................... 257/767 |
| 6,323,555 B1 * | 11/2001 | Maex et al. .................. 257/758 |
| 6,368,967 B1 * | 4/2002 | Besser ......................... 438/687 |
| 6,610,592 B1 * | 8/2003 | Shue et al. .................. 438/623 |
| 6,677,680 B2 * | 1/2004 | Gates et al. ................. 257/758 |
| 6,710,450 B2 * | 3/2004 | Gates et al. ................. 257/759 |
| 6,806,579 B2 * | 10/2004 | Cowley et al. ............. 257/762 |
| 6,815,339 B2 | 11/2004 | Choi |
| 2002/0117737 A1 * | 8/2002 | Gates et al. ................. 257/642 |
| 2002/0117754 A1 * | 8/2002 | Gates et al. ................. 257/758 |
| 2004/0157442 A1 * | 8/2004 | Cowley et al. ............. 438/687 |

FOREIGN PATENT DOCUMENTS

| JP | 2001-176965 | 6/2001 |
| KR | 10-2002-0037326 | 6/2002 |
| WO | WO 00/75982 | 12/2000 |

* cited by examiner

*Primary Examiner*—Laura M. Schillinger
(74) *Attorney, Agent, or Firm*—Young & Thompson

(57) ABSTRACT

A semiconductor device having interconnects is reduced in leakage current between the interconnects and improved in the TDDB characteristic. It includes an insulating interlayer 108, and interconnects 160 filled in grooves formed in the insulating interlayer, including a copper layer 124 mainly composed of copper, having the thickness smaller than the depth of the grooves, and a low-expansion metal layer 140, which is a metal layer having a heat expansion coefficient smaller than that of the copper layer, formed on the copper layer.

5 Claims, 7 Drawing Sheets

SEMICONDUCTOR DEVICE AND METHOD OF FABRICATING THE SAME

This application is based on Japanese patent application No. 2004-053620 the content of which is incorporated hereinto by reference.

DISCLOSURE OF THE INVENTION

1. Field of the Invention

The present invention relates to a semiconductor device having interconnects, and a method of fabricating the same.

2. Related Art

Conventional semiconductor device uses interconnects configured by forming interconnect-forming grooves in an insulating interlayer, and by filling the interconnect-forming grooves with a metal layer such as a copper (Cu) layer (see Japanese Laid-Open Patent Publication No. 2001-176965, for exapmle).

FIG. 11 is a sectional structural view of an exemplary configuration of a conventional semiconductor device.

As shown in FIG. 11, the semiconductor device has semiconductor elements such as transistors, resistors, capacitors and so forth, all of which not shown, formed on a semiconductor substrate 100, and thereon a stopper insulating layer 102 used for terminating etching is formed while placing an insulating layer in between.

On the stopper insulating layer 102, a low-k layer 104 having a dielectric constant smaller than that of silicon oxide layer, and a silicon oxide layer serving as a hard mask layer 106 are formed in this order, wherein the low-k layer 104 and hard mask layer 106 cooperatively form an insulating interlayer 108, in which an interconnect is formed, and which serves as an insulating layer allowing therein formation of interconnect-forming grooves.

On the bottoms and the side walls of the interconnect-forming grooves formed in the insulating interlayer 108, a tantalum (Ta) layer which serves as a barrier metal layer 122 is formed, and the interconnect-forming grooves are filled with a Cu layer 124. The barrier metal layer 122 and the Cu layer 124 cooperatively form interconnects 126. FIG. 11 shows sections of two interconnects 126.

On the insulating interlayer 108, a metal diffusion blocking layer 110 and a silicon oxide layer ($SiO_2$ layer) 112 are formed in this order. The metal diffusion blocking layer 110 and silicon oxide layer 112 cooperatively form an insulating interlayer 114, in which a viahole is formed, allowing therein formation of viaplugs.

A barrier metal layer 128 is formed on the bottom and the side wall of the viaholes formed in the insulating interlayer 114, and a Cu layer 130 is filled in the viaholes. The barrier metal layer 128 and Cu layer 130 cooperatively form viaplugs 132. FIG. 11 shows sections of two viaplugs 132. Each of the viaplugs 132 is connected to each of two interconnects 126.

A method of fabricating the above-described conventional semiconductor device will be briefed below.

Semiconductor elements (not shown) are formed on the semiconductor substrate 100, then the stopper insulating layer 102 as an insulating underlayer, and the insulating interlayer 108 are formed in this order. The interconnect-forming grooves of a predetermined pattern are formed in the insulating interlayer 108, by lithographic and etching processes. The barrier metal layer 122 and a seed layer are then formed, and the Cu layer 124 is filled in the interconnect-forming grooves by electroplating. Cu is then annealed for crystallization. Thereafter, in order to remove the unnecessary portion of Cu, the Cu layer 124 and barrier metal layer 122 are polished by CMP (chemical mechanical polishing) until the top surface of the hard mask layer 106 exposes, to thereby form the interconnects 126. Next, the insulating interlayer 114 is formed. Then, similarly to the method of forming the interconnects 126, the viaholes are formed in the insulating interlayer 114, the barrier metal layer 128 is formed in the viaholes, and Cu layer 130 is filled in the viaholes, to thereby form the viaplugs 132.

Under accelerating trends in micronization of the semiconductor devices and concomitant narrowing of the distance between interconnects being expected for the future, even the above-described conventional configuration of the semiconductor device may result in TDDB (time-dependent dielectric breakdown) failure, due to leakage current between the interconnects applied with an electric field. The reason will be described below.

In the configuration having the interconnects and viaplugs connected as shown in FIG. 11, the metal diffusion blocking layer 110 formed on the interconnects 126 has the largest dielectric constant, so that the electric field becomes more likely to concentrate to the upper portion of the interconnects. Moreover, for the case where the interconnect-forming grooves formed in the insulating interlayer 108 have an upwardly-widened sectional geometry as shown in FIG. 11, the distance between interconnects becomes shortest at the upper portion of the interconnects. In this sort of configuration having the distance between the interconnects shorter than the previous, the electric field will be more likely to concentrate to the upper portion of the interconnects when applied with voltage, and will cause the TDDB failure.

It is also anticipated that the interface between the insulating layers tends to serve as a route for copper diffusion, and that thus-diffused copper may promote leakage current between the interconnects which flows via the interface between the hard mask layer 106 and metal diffusion blocking layer 110, and the interface between the hard mask layer 106 and low-k layer 104.

SUMMARY OF THE INVENTION

According to the present invention, there is provided a semiconductor device which comprises:

an insulating interlayer; and interconnect filled in grooves formed in the insulating interlayer, comprising a copper layer mainly composed of copper, having the thickness smaller than the depth of the grooves, and a metal layer, which is a metal layer having a heat expansion coefficient smaller than that of the copper layer, formed on the copper layer.

In the present invention, the metal layer formed on the copper layer successfully suppresses stretching and shrinkage of the copper layer, and also prevents the copper diffusion. Because the copper layer has the thickness smaller than that of the insulating interlayer, the upper surface of the copper layer and the upper surface of the insulating interlayer reside at different levels of height, and this successfully prevents copper from diffusing from the upper surface of the copper layer via the upper surface of the insulating interlayer during operation of the semiconductor device. This contributes reduction in the leakage current as compared with the conventional technique.

In the semiconductor device of the present invention, the thickness of the interconnects may be larger than the depth of the grooves. In the present invention, the thickness of the copper layer is smaller than the depth of the grooves formed in the insulating interlayer, and the thickness of the interconnects is larger than that depth, so that the upper surface of the insulating interlayer intersects the metal layer. The upper surface of the insulating interlayer never intersects the copper layer, and this is successful in reducing the leakage current between the interconnects via the upper surface of the insulating interlayer.

In the semiconductor device of the present invention, the insulating interlayer may further comprise a low-dielectric-constant layer having a dielectric constant smaller than that of silicon oxide layer, and an insulating layer having a mechanical strength larger than that of the low-dielectric-constant layer layered in this order; and the thickness of the copper layer may be smaller than that of the low-dielectric-constant layer.

In the present invention, the thickness of the copper layer is smaller than that of the low-dielectric-constant layer of the insulating interlayer, so that the boundary between the insulating layer having the mechanical strength and the low-dielectric-constant layer intersects the metal layer. The boundary of two these layers never intersects the copper layer, and this is successful in reducing the leakage current between the interconnects via the interface between the insulating layer having the mechanical strength and the low-dielectric-constant layer.

In the semiconductor device of the present invention, the insulating interlayer may be a single layer having a dielectric constant smaller than that of silicon oxide layer. In the present invention, the insulating interlayer, allowing therein formation of the interconnect(s), will have no interface of the insulating layers which intersects the interconnects, if the insulating layer is configured as a single layer of the low-dielectric-constant layer, and this makes it possible to prevent the copper diffusion via the interface, and the leakage current ascribable thereto.

In the semiconductor device of the present invention, the metal layer may have a heat expansion coefficient of $4.4\times10^{-6}/K$ to $16\times10^{-6}/K$. In the present invention, the heat expansion coefficient adjusted to $4.4\times10^{-6}/K$ to $16\times10^{-6}/K$ makes it possible to ensure a desirable level of breakdown voltage between the interconnects.

In the semiconductor device of the present invention, the metal layer may include at least any one of tungsten, molybdenum, rhenium, tantalum, nickel and cobalt.

According to the present invention, there is also provided a method of fabricating a semiconductor device having interconnect(s), composed of a copper layer mainly composed of copper, formed on a semiconductor substrate, which comprises:

forming an insulating interlayer, allowing therein formation of the interconnect(s), on the semiconductor substrate;

forming grooves in the insulating interlayer;

filling the grooves with the copper layer;

removing the copper layer from the top surface to a predetermined depth; and depositing a metal layer, which is a metal layer having a heat expansion coefficient smaller than that of the copper layer, on the copper layer in the grooves, to thereby form said interconnect(s).

In the present invention, the metal layer can prevent the barrier metal layer from cracking due to stretching and shrinkage of the copper layer during the fabrication process, and can consequently prevent copper ion from drifting via the crack into the insulating layer.

In the present invention, the upper surface of the copper layer and the upper surface of the insulating interlayer reside at different levels of height, and this is successful in preventing Cu ion from diffusing from the upper surface of the Cu layer via the upper surface of the insulating interlayer, when voltage is applied between the interconnects under operation of the semiconductor device. This consequently makes it possible to reduce the leakage current between the interconnects, and to improve the TDDB characteristic.

The metal layer has a heat expansion coefficient smaller than that of the copper layer, so that the metal layer shows smaller stretching or shrinkage than the copper layer shows during the fabrication process. This is successful in preventing the barrier metal layer from cracking due to the stretching and shrinkage of the copper layer, and in preventing copper ion from drifting via the crack into the insulating layer.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The semiconductor device of the present invention is characterized in that the interconnects formed in the insulating interlayer comprise a copper layer and a metal layer having a heat expansion coefficient smaller than that of copper, layered in this order.

First Embodiment

The following paragraphs will explain a semiconductor device of the first embodiment.

Figure 1:
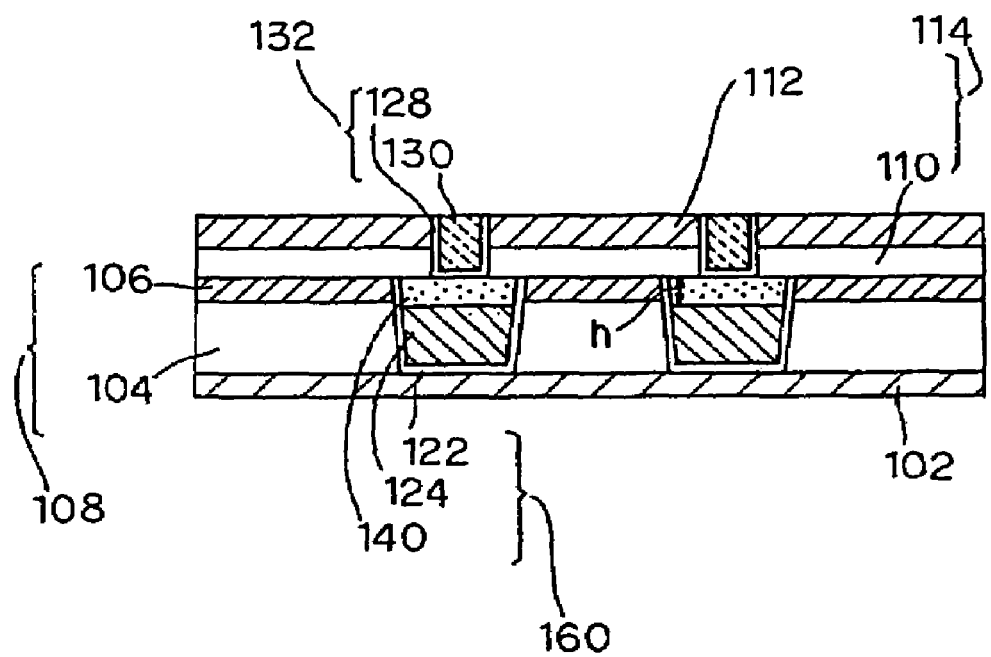
FIG. 1 is a sectional structural view showing an exemplary configuration of a semiconductor device of the present invention.

FIG. 1 is a sectional structural view showing an exemplary configuration of the semiconductor device of this embodiment. It is to be noted that the structure covering the semiconductor substrate up to the layer just below a stopper insulating layer 102 is the same as the conventional structure, and has been omitted from the illustration.

Similarly to as shown in the conventional structure, the semiconductor device has, on the stopper insulating layer 102, an insulating interlayer 108 composed of a low-k layer 104 and a hard mask layer 106. In this embodiment, a barrier metal layer 122 is formed on the bottom and side wall of the interconnect-forming grooves formed in the insulating interlayer 108, and a Cu layer 124 and a low-expansion metal layer 140 (as a metal layer), which is a metal layer having a heat expansion coefficient smaller than that of Cu, are layered in this order in the groove. This makes difference between the levels of height of the upper surface of the Cu layer 124 and the upper surface of the insulating interlayer 108. The formation the low-expansion metal layer 140 on the Cu layer 124 successfully prevents the Cu diffusion from the upper surface of the Cu layer.

In this embodiment, the thickness h of the low-expansion metal layer 140 shown in FIG. 1 is set larger than the thickness of the hard mask layer 106. This is for the purpose of preventing current between the interconnects from becoming more likely to flow on the upper surface of the Cu layer 124 of the interconnect 160, through the interface between the hard mask layer 106 and low-k layer 104. In order to prevent the resistance of the interconnect from becoming excessively large, the thickness of the low-expansion metal layer 140 is adjusted to ⅓ or less of the total thickness of the interconnect 160 formed in the interconnect-forming groove.

Next paragraphs will describe the heat expansion coefficient of a material used for the low-expansion metal layer 140. Samples of the semiconductor device shown in FIG. 1 were fabricated using metals having a variety of heat expansion coefficients for the low-expansion metal layer 140, and were subjected to measurement of breakdown voltage, which is a parameter closely correlated to the TDDB resistance, by applying voltage between the interconnects of the individual samples.

Figure 2:
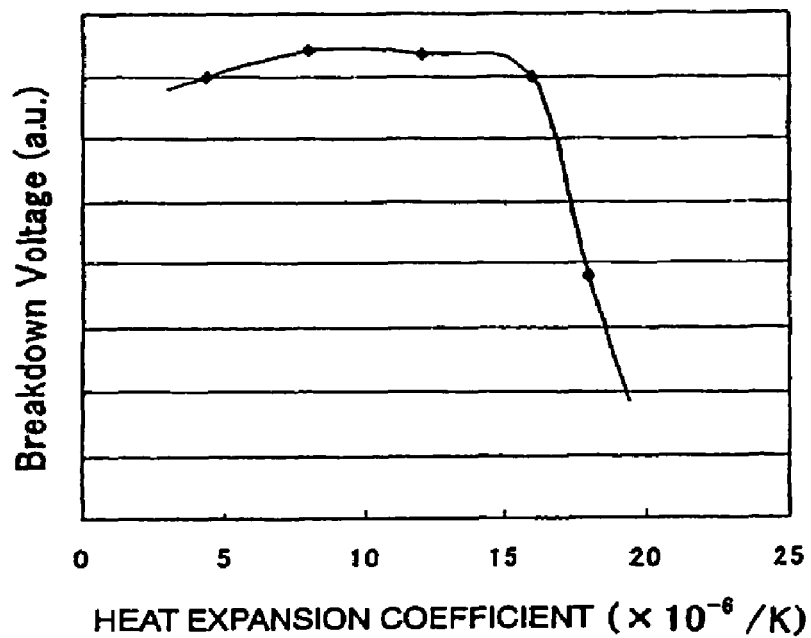
FIG. 2 is a graph showing relations between heat expansion coefficient and breakdown voltage.

FIG. 2 is a graph showing relations between the heat expansion coefficient and breakdown voltage. The ordinate is a scale for the breakdown voltage, and the abscissa is a scale for the heat expansion coefficient. The unit of the ordinate is expressed in voltage, but the scale is expressed by an arbitrary interval (a.u.: arbitrary unit). The values of the heat expansion coefficient are those obtained at an absolute temperature of 500 K.

As shown in FIG. 2, the break down voltage increases as the heat expansion coefficient increases from approximately $4 \times 10^{-6}$/K, and reaches maximum at the heat expansion coefficient of $8 \times 10^{-6}$/K to $16 \times 10^{-6}$/K. Materials composing the low-expansion metal layer 140, capable of maximizing the breakdown voltage, are metals having heat expansion coefficients similar to that of a Ta-base alloy used for the barrier metal layer.

Further changes in the heat expansion coefficient from $10 \times 10^{-6}$/K to $20 \times 10^{-6}$/K result in decrease in the breakdown voltage. The breakdown voltage gradually decreases in a range of the heat expansion coefficient of $10 \times 10^{-6}$/K to $16 \times 10^{-6}$/K. Whereas, the breakdown voltage sharply decreases in a range of heat expansion coefficient of $16 \times 10^{-6}$/K to $20 \times 10^{-6}$/K.

As is shown in FIG. 2, the heat expansion coefficient of the low-expansion metal layer 140 is preferably $16 \times 10^{-6}$/K or below. This is because a heat expansion coefficient of a metal layer formed on the Cu layer 124 of equivalent to, or larger than that of Cu (heat expansion coefficient=$18 \times 10^{-6}$/K) results in heat expansion of the metal layer formed on the Cu layer 124 during the fabrication process to thereby cause cracks in the barrier metal layer 122, and Cu ion tends to drift through the cracks into the insulating layer.

The heat expansion coefficient of the low-expansion metal layer 140 is preferably $4.4 \times 10^{-6}$/K or above. This is because it has been confirmed that the low-expansion metal layer 140 showed a good suppressive effect on the TDDB failure when it was composed of tungsten (heat expansion coefficient=$4.4 \times 10^{-6}$/K).

It is found from the graph shown in FIG. 2 that a heat expansion coefficient of the low-expansion metal layer 140 adjusted within a range from $4.4 \times 10^{-6}$/K to $16 \times 10^{-6}$/K is successful in ensuring a desirable level of breakdown voltage between the interconnects, wherein a heat expansion coefficient within a range from $8 \times 10^{-6}$/K to $16 \times 10^{-6}$/K is particularly preferable.

Besides the above-described tungsten, examples of materials composing the low-expansion metal layer 140 include molybdenum (heat expansion coefficient=$5 \times 10^{-6}$/K), rhenium (heat expansion coefficient=$6.6 \times 10^{-6}$/K), tantalum (heat expansion coefficient=$8 \times 10^{-6}$/K), nickel (heat expansion coefficient=$15 \times 10^{-6}$/K) and cobalt (heat expansion coefficient=$16 \times 10^{-6}$/K). The low-expansion metal layer 140 may also be an alloy layer containing at least one metal listed in the above. The alloy layer can be exemplified by CoWP layer (heat expansion coefficient=$10 \times 10^{-6}$/K to $13 \times 10^{-6}$/K). The low-expansion metal layer 140 has the heat expansion coefficient smaller than that of Cu, and therefore tends not to stretch or shrink during the fabrication process as much as Cu does, and can thereby suppress the stretching and shrinkage of the Cu layer 124.

It is to be understood that the viaplugs 132 and insulating interlayer 114 on the interconnect 160 in this embodiment are configured similarly to those in the conventional example, but it is also allowable to configure the viaplugs 132 by a layered structure of the Cu layer and low-expansion metal layer, similarly to the structure of the interconnects 160.

Next paragraphs will describe experimental results on the semiconductor device of the present embodiment.

Voltage was applied between two interconnects in the configuration shown in FIG. 1, and changes in the current flowing between the interconnects were measured while increasing the voltage applied therebetween. Similar measurement was also made on the conventional configuration for comparison.

Figure 3:
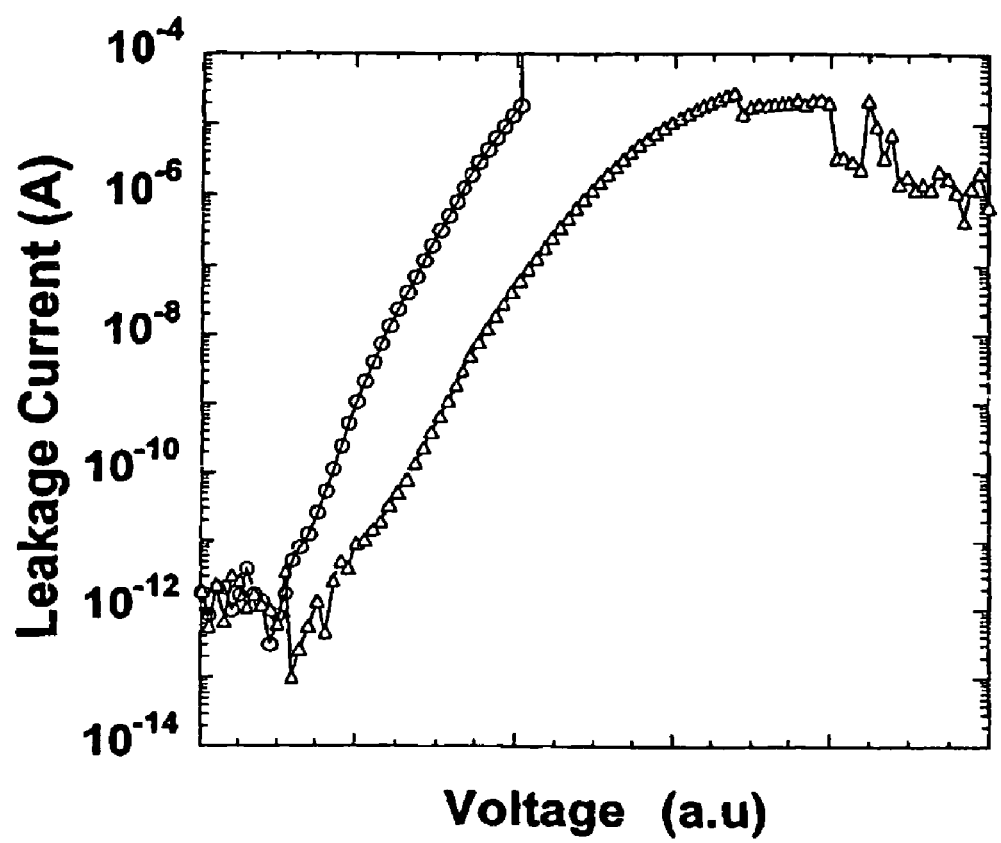
FIG. 3 is a graph showing leakage current between the interconnects in a configuration of a first embodiment.

FIG. 3 is a graph showing the experimental results. The ordinate is a scale for the leakage current between the interconnects, and the abscissa is a scale for the voltage applied between the interconnects. The unit of the abscissa is expressed in voltage, but the scale is expressed by an arbitrary interval (a.u.). Results obtained for the configuration of the present embodiment were plotted with blank triangle marks, and those obtained for the conventional configuration were plotted with blank circle marks.

As is obvious from FIG. 3, voltages where the leakage current measures $10^{-10}$ A in the conventional case result in a leakage current of only as small as $10^{-12}$ A or below in the present embodiment, which is not higher than the detection limit. It is also found that, in a range of voltage causing a leakage current of $10^{-10}$ A to $10^{-5}$ A in the conventional case, the present embodiment shows only a leakage current smaller by two orders of magnitude below the conventional case. It is therefore known from the graph shown in FIG. 3, that the semiconductor device of the present embodiment is successful in reducing the leakage current between the interconnects by approximately two orders of magnitude below the conventional case. This consequently results in improvement in the TDDB characteristic.

The configuration of the present invention is preferably applied to the case where the distance between the interconnects formed in the insulating interlayer is shrunk to less than 0.2 µm, which is narrow enough to raise a problem of the leakage current between the interconnects.

Because the upper surface of the Cu layer 124 and upper surface of the insulating interlayer 108 in the present embodiment reside at different levels of height as described in the above, it is made possible to prevent Cu ion from diffusing from the upper surface of the Cu layer via the upper surface of the insulating interlayer, even under voltage applied between the interconnects during operation of the semiconductor device, and to reduce the leakage current between the interconnects as compared with the conventional case. This is successful in suppressing TDDB failure. In other words, the TDDB characteristic of the interconnects improves.

The low-expansion metal layer 140 has the heat expansion coefficient smaller than that of Cu, so that the low-expansion metal layer 140 shows smaller stretching or shrinkage than the copper layer shows during the fabrication process, and damage possibly given to the lower surface of the insulating interlayer 114 can be suppressed.

Use of material such as cobalt and tungsten, having a resistivity larger than that of Cu, for the low-expansion metal layer 140 further makes it possible to moderate concentration of the electric field at the upper portion between the interconnects, by virtue of the large resistivity of the upper portions of the interconnects.

Next paragraphs will describe a method of fabricating thus-configured semiconductor device.

FIGS. 4A to 4C and FIGS. 5D to 5F are sectional structural views showing the method of fabricating the semiconductor device of the present embodiment. It is to be noted that the fabrication processes from the semiconductor substrate to the layer just below the stopper insulating layer 102 are the same as those in the conventional method, and omitted from the explanation.

Figure 4A:
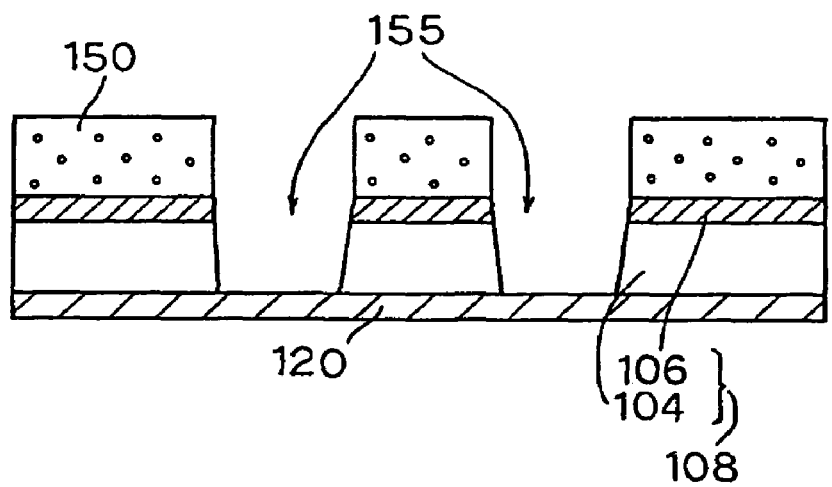
FIGS. 4A to 4C are sectional structural views showing a method of fabricating a semiconductor device of the present invention.

On the stopper insulating layer 102 of 30 to 70 nm thick, the insulating interlayer 108, which comprises the low-k layer 104 of 200 to 300 nm thick and hard mask layer 106 of 10 to 50 nm thick, is formed. Next, according to a lithographic process, a resist layer 150 is formed on the insulating interlayer 108, and is then subjected to light exposure and development to thereby form thereon a pattern used for forming the interconnect-forming groove. The insulating interlayer 108 is then etched through the resist layer 150, selectively in the portion where the upper surface of thereof is exposed, to thereby form the interconnect-forming grooves 155 (FIG. 4A).

Figure 4B:
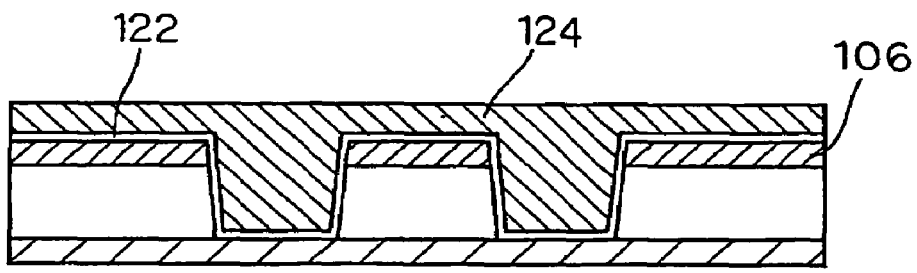

Then, the resist layer 150 is removed, and the barrier metal layer 122 and a seed layer (not show) are formed in this order on the side wall and bottom of the interconnect-forming grooves 155 and on the hard mask layer 106, then the Cu layer 124 is formed by electroplating so as to fill the interconnect-forming grooves 155 (FIG. 4B). Thereafter, Cu crystallization annealing is carried out.

Figure 4C:
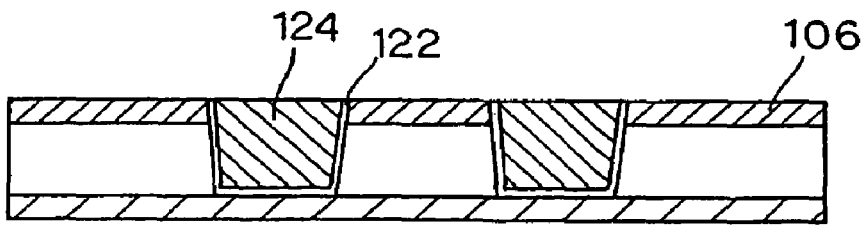

As shown in FIG. 4C, the Cu layer 124 and barrier metal layer 122 are polished by CMP until the upper surface of the hard mask layer 106 exposes. The hard mask layer 106 having a mechanical strength larger than that of the low-k layer 104 is formed herein on the low-k layer 104, so that the hard mask layer 106 can reduce CMP-induced damage possibly introduced into the low-k layer 104.

Figure 5D:
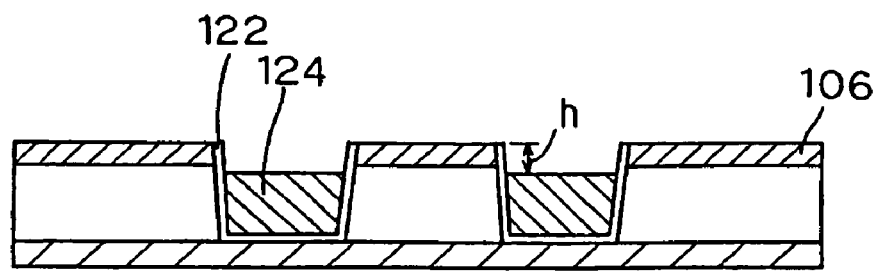
FIGS. 5D to 5F are sectional structural views showing the method of fabricating the semiconductor device of the present invention.

The Cu layer 124 is further removed to a predetermined depth from the surface thereof through wet etching by immersing it into an acidic cleaning/etching solution (FIG. 5D). In this process, amount of decrease h in the layer thickness of the Cu layer 124 through the wet etching is adjusted to ⅓ or less of the depth of the interconnect-forming groove 155 shown in FIG. 4A, and larger than the thickness of the hard mask layer 106. The amount of decrease in the layer thickness h, set larger than the thickness of the hard mask layer 106, makes the thickness of the Cu layer 124 in the interconnect-forming grooves 155 smaller than the thickness of the low-k layer 104.

Figure 5E:
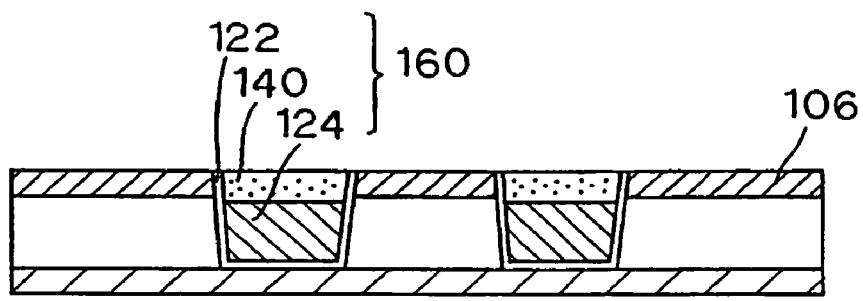

Then, as shown in FIG. 5E, tungsten is deposited as a low-expansion metal layer 140 on the Cu layer 124 in the interconnect-forming grooves, through dipping in an electroless plating solution, to thereby complete the interconnects 160. It is also allowable herein to adopt selective CVD (chemical vapor deposition) process to form the low-expansion metal layer 140.

Figure 5F:
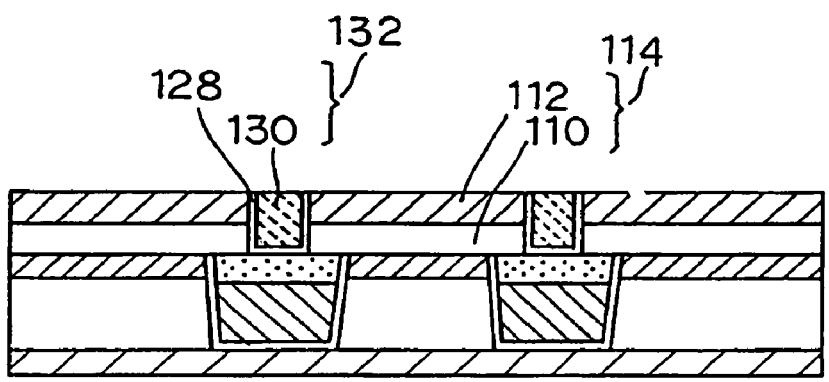

Thereafter, the insulating interlayer 114 which comprises the silicon oxide layer 112 and the metal diffusion blocking layer 110 of 30 to 70 nm thick is formed, the viaholes are formed by the lithographic process and etching process similarly to those in the conventional process, and the viaplugs 132 which comprise the barrier metal layer 128 and Cu layer 130 are formed in the viaholes (FIG. 5F).

In the fabrication method of the present embodiment, the low-expansion metal layer 140 successfully prevents the Cu layer 124 from stretching and shrinking during the fabrication process and thereby from causing cracks in the barrier metal layer 122, and consequently prevents Cu ion from drifting via the cracks into the insulating layer.

The present embodiment has explained the single damascene process in which the viaplugs 132 and interconnects (not shown) formed on the viaplugs 132 are separately formed, but it is also allwable to adopt the dual damascene process.

Second Embodiment

The present embodiment relates to a case in which the low-expansion metal layer is formed to a level of height above the upper surface of the hard mask layer.

A semiconductor device of the present embodiment will be explained.

Figure 6:
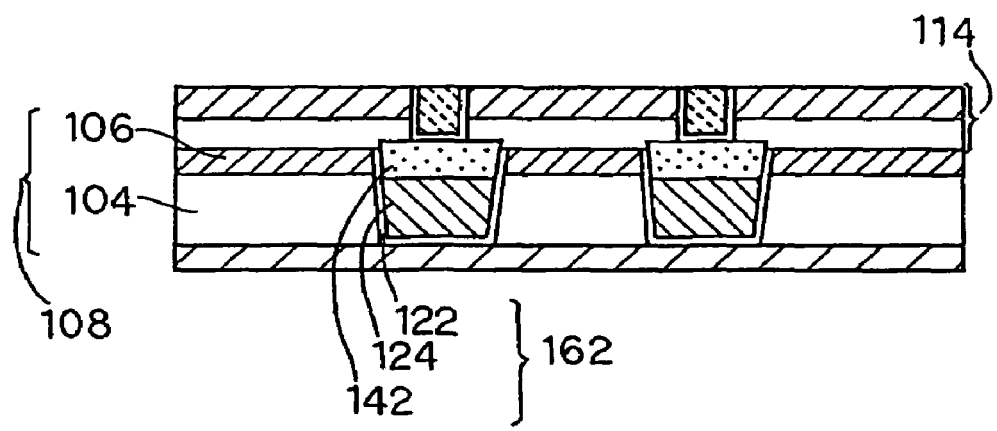
FIG. 6 is a sectional structural view showing a configuration of a semiconductor device of a second embodiment.

FIG. 6 is a sectional structural view showing an exemplary configuration of the semiconductor device of the present embodiment. It is to be noted that any configurations similar to those in the first embodiment will be given with the same reference numerals, omitting the explanations therefor.

An interconnects 162 in the semiconductor device of the present embodiment are configured so that a low-expansion metal layer 142 (as a metal layer) on the Cu layer 124 is formed up to a level of height higher than the upper surface of the hard mask layer 106. The low-expansion metal layer 142 partially blocks the boundary between the insulating interlayer 108 and an insulating interlayer 114. In view of preventing the resistance of the interconnect from becoming too large, it is preferable to adjust the thickness of the low-expansion metal layer 142 to ⅓ or less of the total thickness of the interconnects 162. It is to be noted herein that the insulating interlayer 108 has a configuration having the low-k layer 104 and hard mask layer 106 layered in this order, similarly to as shown in the first embodiment.

A method of fabricating the semiconductor device of the present embodiment is similar to that shown in the first embodiment, except that the low-expansion metal layer 142 is formed thicker than that in the first embodiment, so that they will not be detailed herein.

In the present embodiment, the upper surface of the low-expansion metal layer 142 and the upper surface of the hard mask layer 106 reside on different levels of height, and the low-expansion metal layer 142 partially blocks the boundary between the insulating interlayer 108 and insulating interlayer 114, and this is successful in reducing the leakage current via the interface between two these insulating interlayers between the interconnects, and in improving the TDDB characteristic of the interconnects.

Next paragraphs will explain experimental results on the semiconductor device of the present embodiment.

Similarly to as descried in the first embodiment, voltage was applied between two interconnects in the configuration shown in FIG. 6, and changes in the current flowing between the interconnects were measured.

Figure 7:
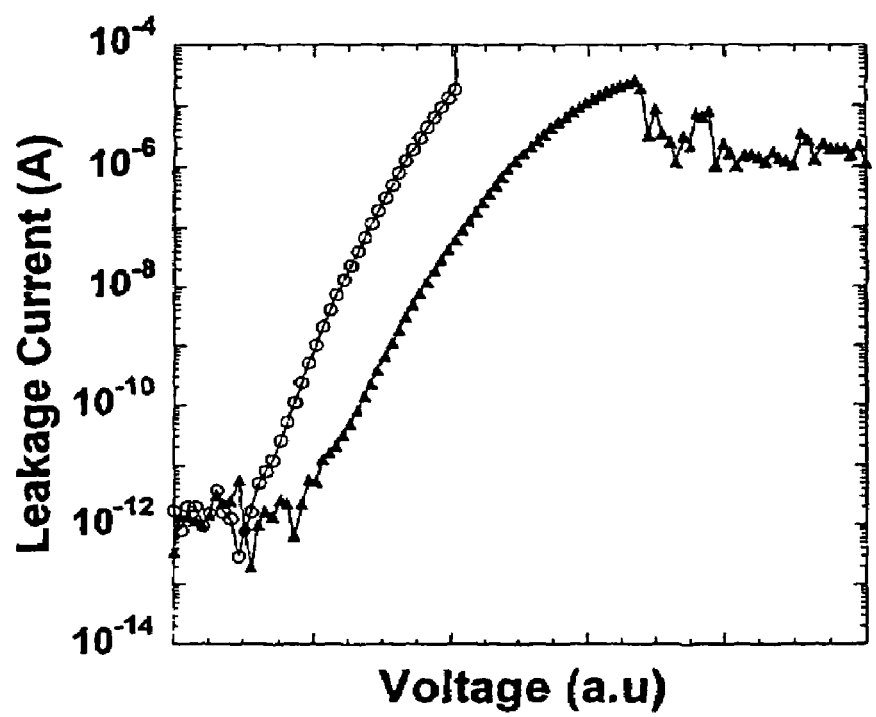
FIG. 7 is a graph showing leakage current between the interconnects in the configuration of the second embodiment.

FIG. 7 is a graph showing the experimental results. The ordinate and abscissa are equivalent to those in FIG. 3. Results of the present embodiment were plotted by filled triangle marks, and those correspondent to the conventional case were plotted with blank circle marks.

As is obvious from FIG. 7, voltages until the leakage current measures $10^{-10}$ A in the conventional case result in a leakage current of only as small as $10^{-12}$ A or below in the present embodiment. It is also found that, in a range of voltage causing a leakage current of $10^{-10}$ A to $10^{-5}$ A in the conventional case, the present embodiment shows only a leakage current smaller by two orders of magnitude below the conventional case. It is therefore known from the graph shown in FIG. 7, that the semiconductor device of the present embodiment is successful in reducing the leakage current between the interconnects by approximately two orders of magnitude below the conventional case. This consequently results in improvement in the TDDB characteristic.

Third Embodiment

The present embodiment relates to a case where the hard mask layer, formed on the insulating interlayer shown in the second embodiment, is omitted.

Next paragraphs will explain the semiconductor device of the present embodiment.

Figure 8:
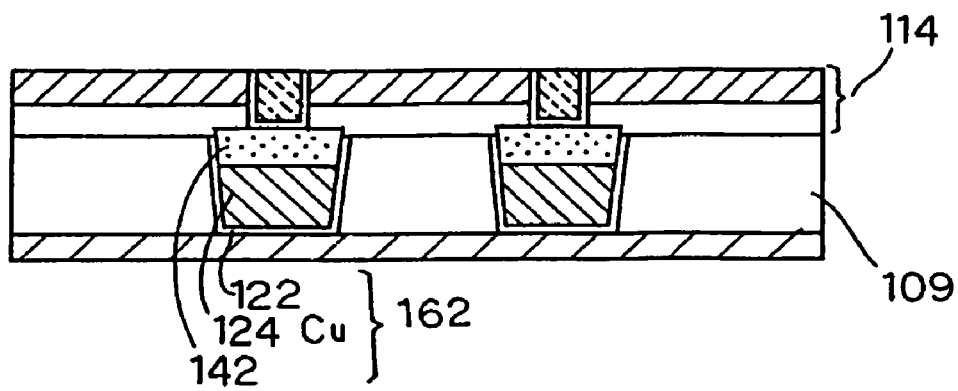
FIG. 8 is a sectional structural view showing a configuration of a semiconductor device of a third embodiment.

FIG. 8 is a sectional structural view showing an exemplary configuration of the semiconductor device of the present embodiment. It is to be noted that any configurations similar to those in the second embodiment will be given with the same reference numerals, omitting the detailed explanations therefor.

An insulating interlayer 109 of the present embodiment is configured by a low-k layer. On the low-k layer, the insulating interlayer 114 is formed without being underlain by the hard mask layer. Similarly to as described in the second embodiment, the barrier metal layer 122, Cu layer 124, and low-expansion metal layer 142 are formed in the interconnect-forming grooves, to thereby form the interconnects 162. The low-expansion metal layer 142 is formed so as to have the level of height of the upper surface thereof higher than the upper surface of an insulating interlayer 109. In view of preventing the resistance of the interconnects from becoming too large, it is preferable to adjust the thickness of the low-expansion metal layer 142 to ⅓ or less of the total thickness of the interconnects 160.

A method of fabricating the semiconductor device of the present embodiment is equivalent to that described in the first embodiment, except that the low-expansion metal layer 142 is formed thicker than that in the first embodiment, and that the low-k layer is formed to a large thickness in place of forming the hard mask layer, so that the explanation therefor will not be given.

The present embodiment is successful not only in obtaining the effects equivalent to those in the second embodiment, but also in reducing the leakage current between the interconnects via the interface between the hard mask layer and low-k layer, because of absence of the hard mask layer in the insulating interlayer, and consequently successful in further improving the TDDB characteristic.

Next paragraphs will explain experimental results of the present embodiment.

Similarly to as descried in the first embodiment, voltage was applied between two interconnects in the configuration shown in FIG. 8, and changes in the current flowing between the interconnects were measured.

Figure 9:
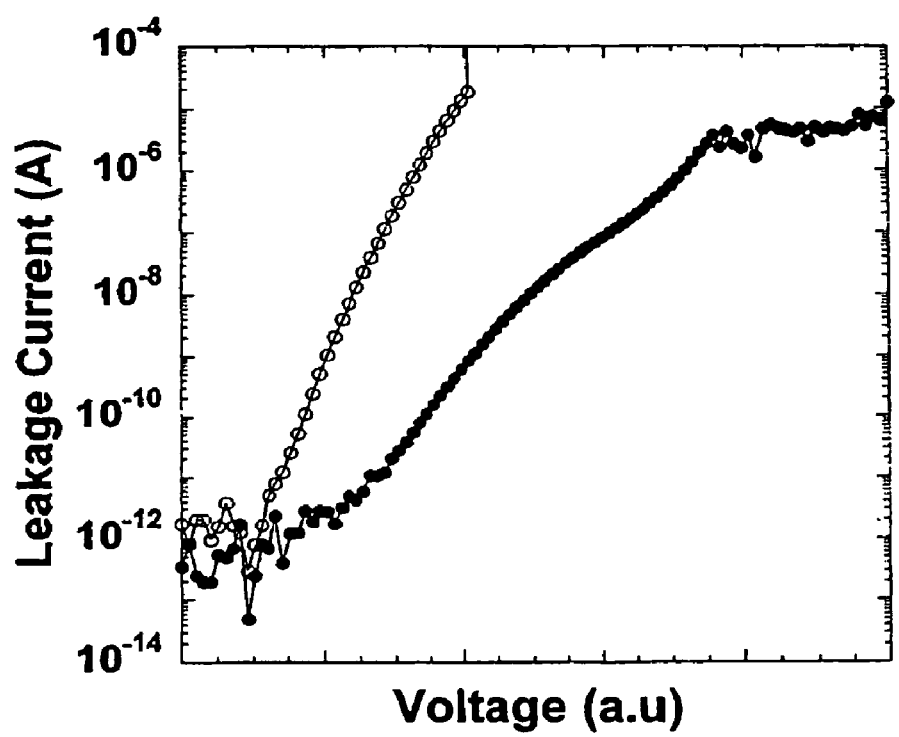
FIG. 9 is a graph showing leakage current between the interconnects in the configuration of the third embodiment.

FIG. 9 is a graph showing the experimental results. The ordinate and abscissa are equivalent to those in FIG. 3. Results of the present embodiment were plotted by filled circle marks, and those correspondent to the conventional case were plotted with blank circle marks.

As is obvious from FIG. 9, at a voltage causing a leakage current of $10^{-10}$ A in the conventional case, the present embodiment shows only a leakage current smaller by approximately 1.5 orders of magnitude below the conventional case. At a voltage causing a leakage current of $10^{-9}$ A in the conventional case, the present embodiment shows only a leakage current smaller by approximately 2.5 orders of magnitude below the conventional case. Also at a voltage causing a leakage current of $10^{-6}$ A in the conventional case, the present embodiment shows only a leakage current smaller by approximately 4 orders of magnitude below the conventional case.

As is known from the above, difference between the leakage currents between the conventional case and the present embodiment grows larger as the voltage increases. It is known from the graph shown in FIG. 9, that the semiconductor device of the present embodiment is successful in reducing the leakage current between the interconnects by approximately 1.5 to 4 orders of magnitude below the conventional case. This consequently results in improvement in the TDDB characteristic.

Figure 10:
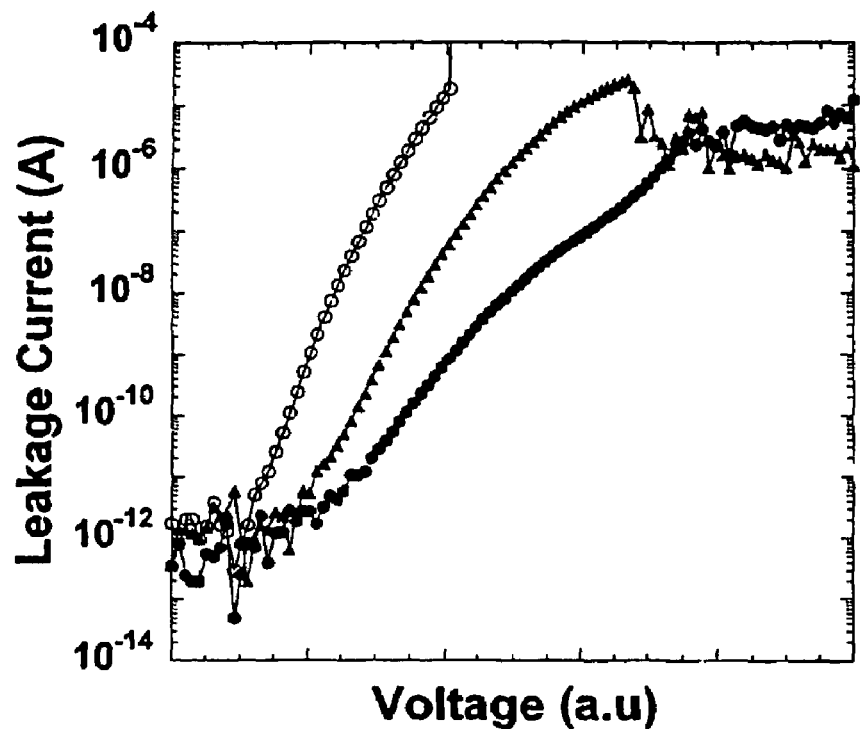
FIG. 10 is a graph showing experimental results of the second embodiment, third embodiment and a conventional case.
Figure 11:
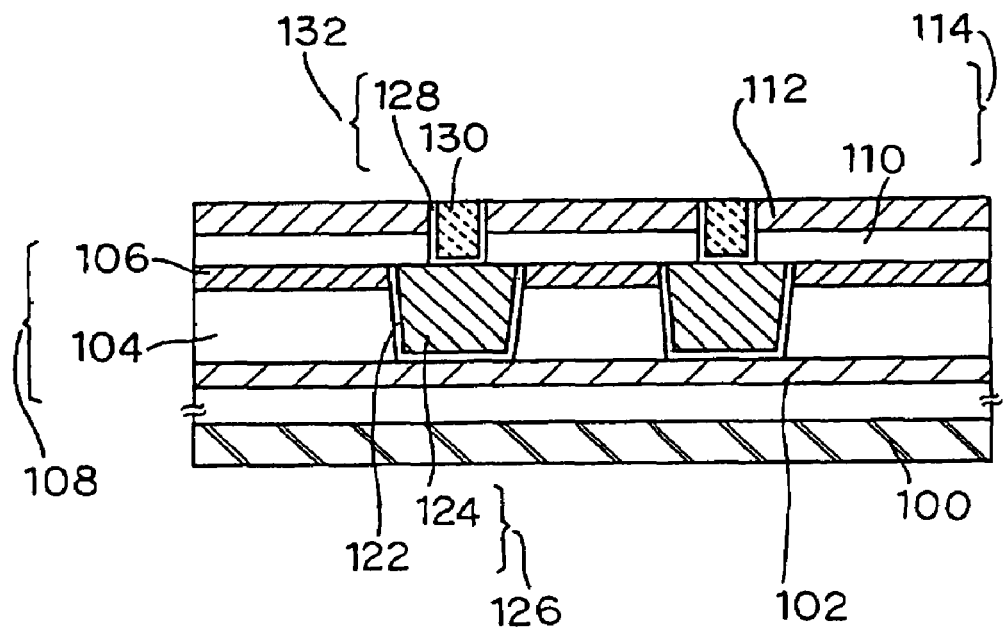
FIG. 11 is a sectional structural view showing an exemplary configuration of a conventional semiconductor device.

FIG. 10 is a graph comparatively shows the leakage currents in the second embodiment, third embodiment and conventional case. The ordinate and abscissa are equivalent to those in FIG. 3. Results of the second embodiment were plotted with filled triangle marks, those correspondent to the third embodiment with filled circle marks, and those correspondent to the conventional case with blank circle marks.

As is obvious from FIG. 10, at a voltage causing a leakage current of $10^{-7}$ A in the conventional case, the second embodiment shows only a leakage current smaller by approximately 2.5 orders of magnitude below the conventional case, and the third embodiment shows only a leakage current further smaller by approximately one order of magnitude below the second embodiment. It is obvious from the graph shown in FIG. 10, that the third embodiment can further reduce the leakage current as compared with the second embodiment. It was therefore confirmed that the absence of the hard mask layer in the insulating interlayer is successful in reducing the leakage current between the interconnects, and in further improving the TDDB characteristic.

It is also allowable to disuse the hard mask layer 106 in the first embodiment. Also this configuration is successful in reducing the leakage current which tends to flow between the interconnects via the interface between the hard mask layer 106 and low-k layer 104, and in improving the TDDB characteristic.

Further, the first embodiment and second embodiment, the hard mask layer 106 is not limited to the silicon oxide layer, but may be a SiC layer.

Moreover, the first embodiment, second embodiment and third embodiment, it is all enough for the Cu layer 124 to be mainly composed of Cu, and not limited pure Cu, but may contain other elements.

It is still also allowable to use a low-k layer in place of the silicon oxide layer 112 as the insulating interlayer 114.

It is apparent that the present invention is not limited to the above embodiments, that may be modified and changed without departing from the scope and spirit of the invention.

What is claimed is:

1. A semiconductor device comprising:
   an insulating interlayer having a low-dielectric-constant layer with a dielectric constant smaller than that of silicon oxide and, on said low-dielectric-constant layer, an insulating layer having a mechanical strength larger than that of said low-dielectric-constant layer; and
   an interconnect filled in a groove that extends through said insulating layer and said low-dielectric-constant layer, said interconnect comprising a copper layer mainly composed of copper and having a thickness smaller than the depth of said groove, and a metal layer having a heat expansion coefficient smaller than that of said copper layer, formed on said copper layer,
   wherein said metal layer is thicker than said insulating layer.

2. The semiconductor device according to claim 1, wherein the thickness of said interconnect is larger than the depth of said groove.

3. The semiconductor device according to claim 1, wherein the thickness of said copper layer is smaller than that of said low-dielectric-constant layer.

4. The semiconductor device according to claim 1, wherein said metal layer has a heat expansion coefficient of $4.4 \times 10^{-6}$/K to $16 \times 10^{-6}$/K.

5. The semiconductor device according to claim 4 wherein said metal layer includes at least one of tungsten, molybdenum, rhenium, tantalum, nickel and cobalt.

* * * * *